(12) United States Patent
Bowden et al.

(10) Patent No.: US 10,579,115 B2
(45) Date of Patent: *Mar. 3, 2020

(54) THERMAL MANAGEMENT ASSEMBLY

(71) Applicant: HEWLETT PACKARD ENTERPRISE DEVELOPMENT LP, Houston, TX (US)

(72) Inventors: Thomas Robert Bowden, Houston, TX (US); Alan B Doerr, Magnolia, TX (US); John Franz, Houston, TX (US); Melvin K Benedict, Magnolia, TX (US); Joseph Allen, Tomball, TX (US); John Norton, Houston, TX (US); Binh Nguyen, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/139,109

(22) Filed: Sep. 24, 2018

(65) Prior Publication Data
US 2019/0025896 A1    Jan. 24, 2019

Related U.S. Application Data

(63) Continuation of application No. 15/120,511, filed as application No. PCT/US2014/036158 on Apr. 30, 2014, now Pat. No. 10,114,433.

(51) Int. Cl.
*G06F 1/20*     (2006.01)
*G06F 1/18*     (2006.01)
(Continued)

(52) U.S. Cl.
CPC ............. *G06F 1/206* (2013.01); *G06F 1/185* (2013.01); *G06F 1/20* (2013.01); *G06F 13/42* (2013.01);
(Continued)

(58) Field of Classification Search
CPC ............. G06F 1/185; G06F 1/206; G06F 1/20
See application file for complete search history.

(56) References Cited

U.S. PATENT DOCUMENTS 5,966,287 A    10/1999    Lofland et al.
6,233,150 B1 *    5/2001    Lin ...................... H05K 9/0039
                                                        165/185

(Continued)

FOREIGN PATENT DOCUMENTS

JP    2013520812 A    6/2013
KR    100856703 B1    9/2008
(Continued)

OTHER PUBLICATIONS

International Search Report and Written Opinion, International Application No. PCT/US2014/036158, dated Jan. 27, 2015, pp. 1-16, KIPO.

*Primary Examiner* — Nidhi Thaker

(57) ABSTRACT

A thermal management assembly in accordance with one example may include a first thermal management member that includes a first main region that is continuous, a first connection region that is discontinuous, and a first top side. The thermal management assembly may also include a second thermal management member that includes a second main region, a second connection region, and a second top side. The second main region and the second connection region are continuous. The thermal management assembly may further include a connection member to couple the first thermal management member and the second thermal management member to a memory device via the first connection region and the second connection region. The first top side and the second top side are substantially level with a top side of the memory device in a horizontal direction when the (Continued)

first thermal management member and the second thermal management member are coupled to the memory device.

16 Claims, 4 Drawing Sheets

(51) Int. Cl.
    *H01L 23/367*     (2006.01)
    *H01L 23/40*     (2006.01)
    *G06F 13/42*     (2006.01)

(52) U.S. Cl.
    CPC ........ *H01L 23/367* (2013.01); *H01L 23/4093* (2013.01); *H01L 2924/0002* (2013.01)

(56) References Cited

U.S. PATENT DOCUMENTS

| | | | |
|---|---|---|---|
| 7,382,617 B2 | 6/2008 | Yu et al. | |
| 7,518,873 B2 | 4/2009 | Park et al. | |
| 8,018,723 B1 * | 9/2011 | Yu | H01L 23/367 |
| | | | 257/707 |
| 8,287,291 B1 | 10/2012 | Bhakta et al. | |
| 8,488,325 B1 | 7/2013 | Yu | |
| 8,559,181 B2 | 10/2013 | Clayton et al. | |
| 8,649,177 B2 | 2/2014 | Chainer et al. | |
| 8,913,384 B2 * | 12/2014 | David | H05K 13/00 |
| | | | 361/679.53 |
| 9,250,934 B2 * | 2/2016 | Berke | G11C 5/14 |
| 2007/0223198 A1 * | 9/2007 | Lai | H01L 23/3672 |
| | | | 361/720 |
| 2007/0263359 A1 * | 11/2007 | Lai | H01L 23/3672 |
| | | | 361/715 |
| 2008/0174965 A1 | 7/2008 | Hsu | |
| 2009/0103269 A1 * | 4/2009 | Liu | G06F 1/20 |
| | | | 361/719 |
| 2010/0000655 A1 * | 1/2010 | Ni | H01L 23/3672 |
| | | | 156/60 |
| 2013/0343005 A1 | 12/2013 | David et al. | |
| 2014/0004731 A1 | 1/2014 | Hoang | |

FOREIGN PATENT DOCUMENTS

| | | |
|---|---|---|
| KR | 1020100016715 A | 2/2010 |
| TW | M354784 U | 4/2009 |
| TW | I326023 B | 6/2010 |
| TW | 201311126 A | 3/2013 |

* cited by examiner

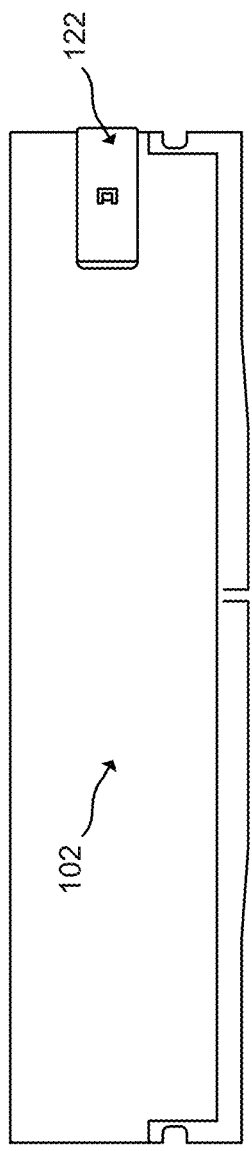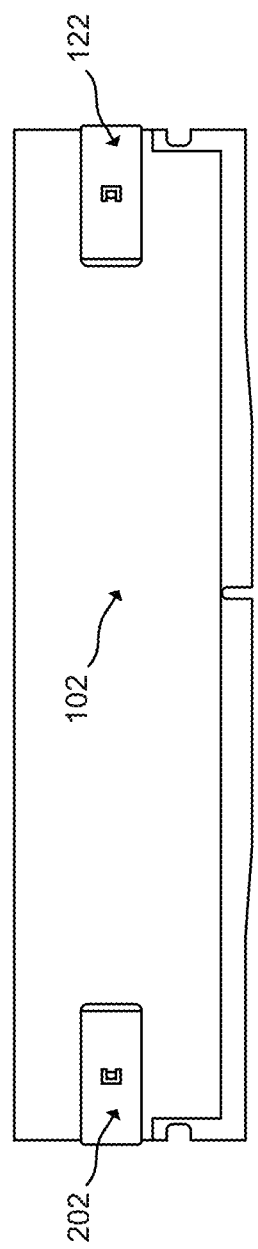

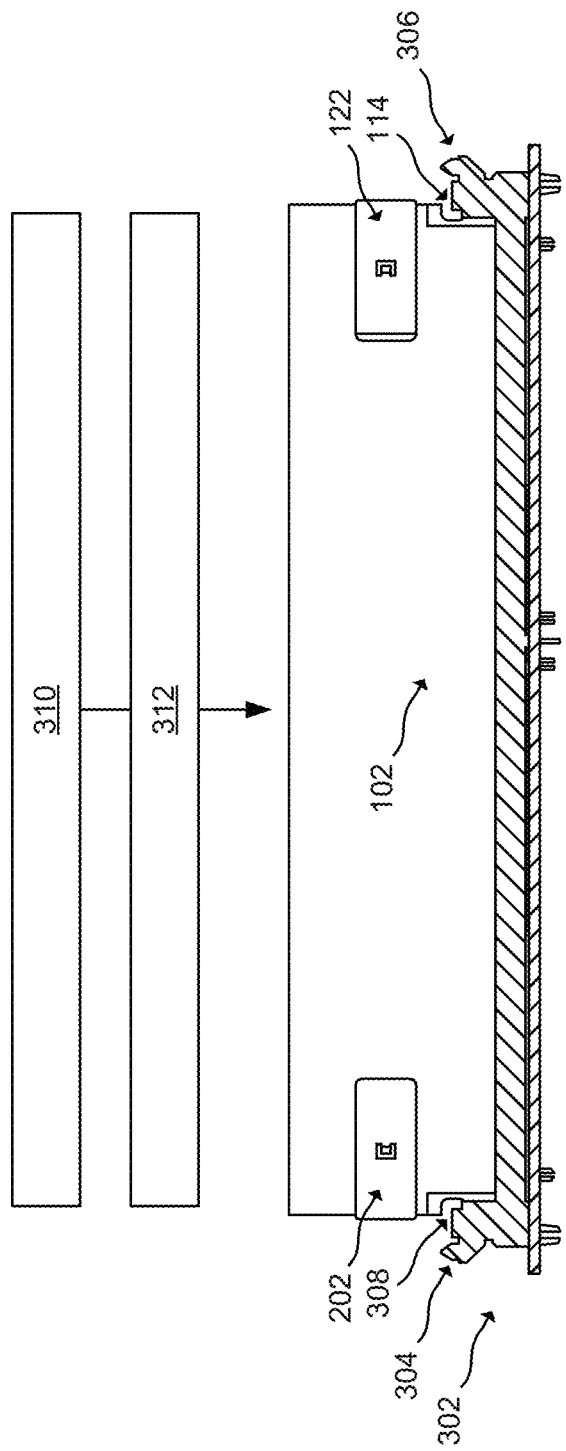

THERMAL MANAGEMENT ASSEMBLY

BACKGROUND

There are many types of computer data storage devices. One type of computer data storage device is random access memory (RAM). RAM is used to temporarily store data while a computing device is powered on. RAM may be implemented using integrated circuits in the form of a memory module, such as a dual-inline memory module (DIMM).

BRIEF DESCRIPTION OF THE DRAWINGS

Some examples of the present application are described with respect to the following figures:

FIG. 2A is a front view of the example thermal management assembly of FIGS. 1A-1C, FIG. 2B is a front view of another example thermal management assembly of FIGS. 1A-1C, FIG. 3 is a front view of an example thermal management assembly inserted into an example memory device socket.

DETAILED DESCRIPTION

As described above, random access memory (RAM) may be implemented using integrated circuits in the form of a memory module, such as a dual-inline memory module (DIMM). During operation, a DIMM may generate heat as a result of electrical current passing through the DIMM. The heat generated by a DIMM may increase the device temperature of the DIMM. Excessively high device temperature may reduce an operational life and/or function of a DIMM.

Examples described herein address the above challenges by providing a thermal management assembly that can be coupled to a memory device. For example, the thermal management assembly may include a first thermal management member, a second thermal management member, and a connection member. The connection member may couple the first thermal management member and the second thermal management member to a memory device, such as a DIMM. The first thermal management member may include a first main region that is continuous and a first connection region that is discontinuous. The second thermal management member may include a second main region and a second connection region. The second main region and the second connection region may be continuous. A first top side of the first thermal management member and a second top side of the second thermal management member may be substantially aligned with a top side of the memory device in a horizontal direction when the first thermal management member and the second thermal management member are coupled to the memory device. In this manner, examples described herein may enable a memory device to reduce a device temperature of the memory device.

Figure 1A:
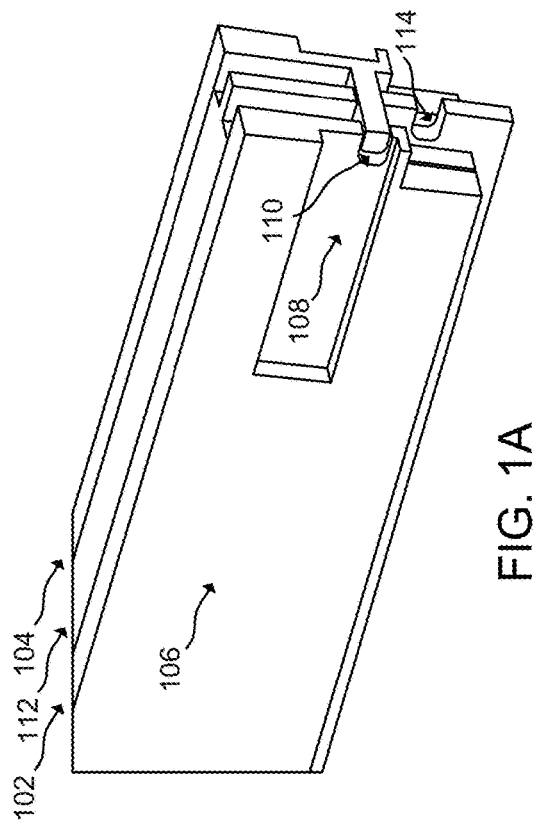
FIG. 1A is a side view of an example first thermal management member of an example thermal management assembly.

Referring now to the figures, FIG. 1A is a side view of an example first thermal management member of an example thermal management assembly. The thermal management assembly may be a device suitable to extract or draw heat away from a semiconductor device, such as a memory device. The thermal management assembly may include a first thermal management member 102 and a second thermal management member 104. Second thermal management member 104 is described in more detail in FIG. 1B. First thermal management member 102 may include a first main region 106 and a first connection region 108. First main region 106 may be a continuous region. As used herein, a continuous region may be a region that is devoid of any through openings and/or recesses. In some examples, first main region 106 may be a substantially flat region that is devoid of any other features that extend from a surface of first main region 106, such as fins. First connection region 108 may be a recess region of first thermal management member 102. First connection region 108 may include an opening 110. Opening 110 may be a through opening to receive a connection tab from second thermal management member 104. Thus, first connection region 108 may be a discontinuous region. As used herein, a discontinuous region may be a region that includes a through opening. Opening 110 may be aligned with an upper notch (not shown) of a memory device 112 when first thermal management member 102 is coupled to memory device 112. In some examples, memory device 112 may be a DIMM that is compliant with a double data rate (DDR) 4 protocol. Memory device 112 may also include a lower notch 114.

Figure 1B:
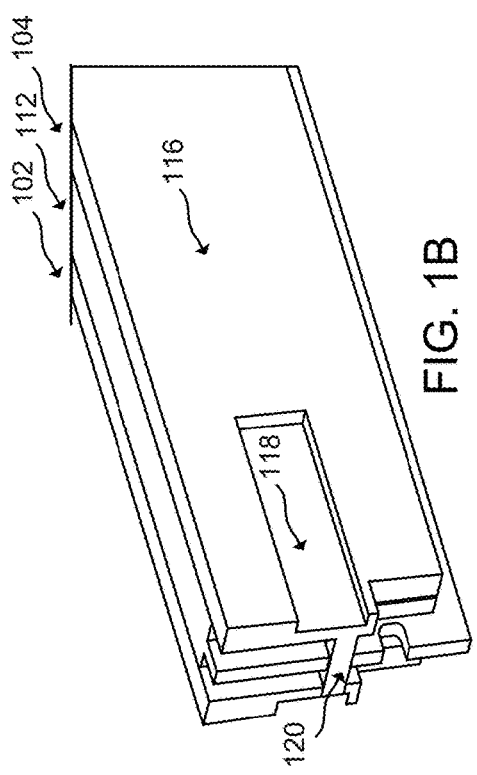
FIG. 1B is a side view of an example second thermal management member of the example thermal management assembly.

FIG. 1B is a side view of an example second thermal management member of the example thermal management assembly. Second thermal management member 104 may include a second main region 116 and a second connection region 118. Second main region 116 may be a continuous region. In some examples, second main region 116 may be a substantially flat region that is devoid of any other features that extend from a surface of second main region 116, such as fins. Second connection region 118 may be a recess region of second thermal management member 104. Second connection region 118 may be a continuous region. Second connection region 118 may include a connection tab 120. Connection tab 120 may be inserted into opening 110 and upper notch of memory device 112. Thus, connection tab 120 may be aligned with the upper notch of memory device 112 when second thermal management member 104 is coupled to memory device 112.

Figure 1C:
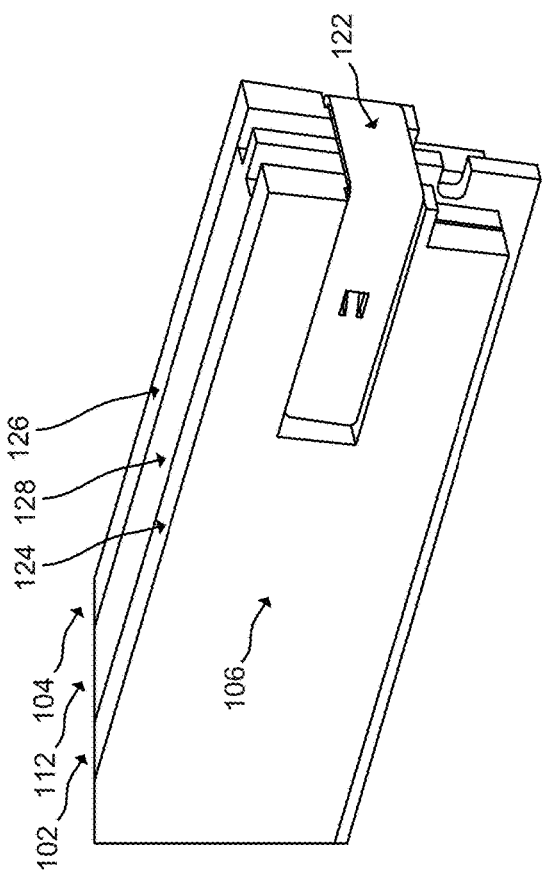
FIG. 1C is a side view of an example connection member of the example thermal management assembly.

FIG. 1C is a side view of an example connection member of the example thermal management assembly. The thermal management assembly may also include a connection member 122. Connection member 122 may be formed so that a first region of connection member 122 is inserted into first connection region 108 and a second region of connection member 122 is inserted into second connection region 118. Connection member 122 may couple first thermal management member 102 and second thermal management member 104 to memory device 112. Connection member 122 may be inserted into first connection region 108 and second connection region 118 in a horizontal direction so that the overall device height of memory device 112 is not increased when first thermal management member 102 and second thermal management member 104 are coupled to memory device 112. Thermal management members 102 and 104 and connection member 122 may be made using different materials, such as aluminum alloy, copper, or other metal. In some examples, thermal management members 102 and 104 may be vapor chambers, heat pipes, coolant liquid filled cavities, etc.

When first thermal management member 102 and second thermal management member 104 are coupled to memory device 112, a first top side 124 of first thermal management member 102 and a second top side 126 of second thermal management member are substantially flush or level with a third top side 128 of memory device 112 in a horizontal direction. For example, when first thermal management member 102 and second thermal management member 104 are coupled to memory device 112, a height difference among first top side 124, second top side 126, and third top side 128 may be approximately in the range of +/−0.010 inch. First top side 124 may have substantially the same thickness as first main region 106. Second top side 126 may have substantially the same thickness as second main region 116.

FIG. 2A is a front view of the example thermal management assembly of FIGS. 1A-1C. As illustrated in FIG. 2A, in some examples, first thermal management member 102 may include a single connection region, such as first connection region 108 (not shown in FIG. 2A). Second thermal management member 104 may also include a single connection region, such as second connection region 118 (not shown in FIG. 2A). Thus, a single connection member, such as connection member 122, may couple first thermal management member 102 and second thermal management member 104 to memory device 112.

FIG. 2B is a front view of another example thermal management assembly of FIGS. 1A-1C. As illustrated in FIG. 2B, in some examples, first thermal management member 102 may include multiple connection regions (not shown in FIG. 2B). Second thermal management member 104 may also include multiple connection regions (not shown in FIG. 2B). Thus, multiple connection members, such as connection member 122 and a second connection member 202, may be used to couple first thermal management member 102 and second thermal management member 104 to memory device 112.

FIG. 3 is a front view of an example thermal management assembly inserted into an example memory device socket. During operation, memory device 112 coupled to first thermal management member 102 and second thermal management member 104 may be inserted into a memory device socket 302. Memory device socket 302 may include a first retention clip 304 and a second retention clip 306. Retention clips 304 and 306 may be pushed into lower notches 308 and 114 respectively to secure memory device 112 in memory device socket 302. Thus, by using memory device socket 302 to secure memory device 112 via lower notches 308 and 114, the overall height of memory device 112 when inserted into a memory device socket is not increased as compared to securing memory device 112 via the upper notches.

In some examples, heat may be removed from memory device 112 via liquid cooling. For example, a liquid cooling assembly 310 may be used to remove heat from memory device 112. Liquid cooling assembly 310 may include a plurality of components, such as a liquid pump and a reservoir. A liquid cooling plate 312 may be coupled to a liquid cooling assembly 310. Liquid cooling plate 312 may also be in contact with top sides of memory device 112 and thermal management members 102 and 104, such as top sides 124-128. During operation, memory device 112 may generate heat as a result of electrical current passing through circuits of memory device 112. Because main regions 106 and 116 are continuous, heat generated by memory device 112 may be absorbed by thermal management members 102 and 104 instead of dissipating into areas near memory device 112.

When liquid cooling plate 312 is in contact with top sides 124-128, liquid cooling plate 312 may draw heat absorbed thermal management members 102 and 104 and heat generated by memory device 112 away using liquid circulating through liquid cooling plate 312. Thus, the device temperature of memory device 112 is reduced.

Figure 4:
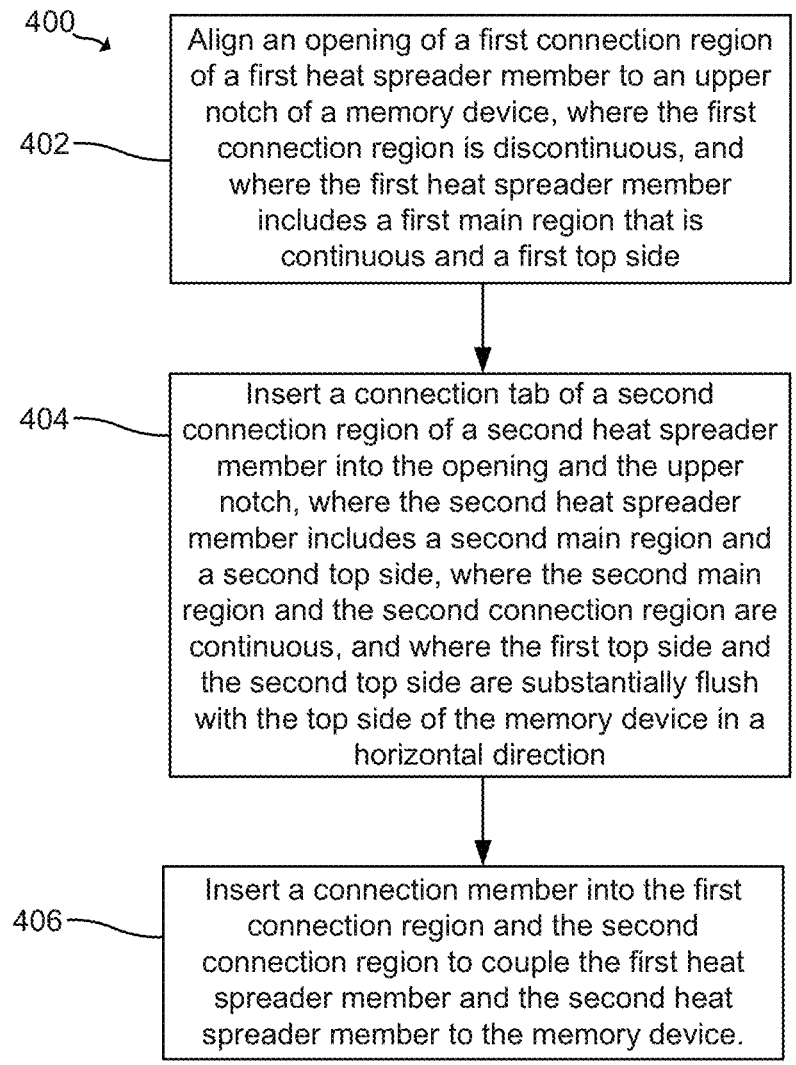
FIG. 4 is a flowchart illustrating an example method of coupling a thermal management assembly to a memory device.

FIG. 4 is a flowchart illustrating an example method 400 of coupling a thermal management assembly to a memory device. Method 400 includes aligning an opening of a first connection region of a first thermal management member to an upper notch of a memory device, where the first connection region is discontinuous, and where the first thermal management member includes a first main region that is continuous and a first top side, at 402. For example, referring to FIG. 1A, opening 110 may be aligned with an upper notch (not shown) of a memory device 112 when first thermal management member 102 is coupled to memory device 112.

Method 400 also includes inserting a connection tab of a second connection region of a second thermal management member into the opening and the upper notch, where the second thermal management member includes a second main region and a second top side, where the second main region and the second connection region are continuous, and where the first top side and the second top side are substantially flush with the top side of the memory device in a horizontal direction, at 404. For example, referring to FIG. 1B, connection tab 120 may be inserted into opening 110 and upper notch of memory device 112.

Method 400 further includes inserting a connection member into the first connection region and the second connection region to couple the first thermal management member and the second thermal management member to the memory device, at 406. For example, referring to FIG. 10, connection member 122 may be inserted into first connection region 108 and second connection region 118 in a horizontal direction.

The use of "comprising", "including" or "having" are synonymous and variations thereof herein are meant to be inclusive or open-ended and do not exclude additional unrecited elements or method steps.

What is claimed is:

1. A memory module cooling device, comprising: two thermal members, each having: a first side to couple to a memory module: and a second side opposite from the first side, the second side having a flat surface, and a first recess that is recessed from the flat surface; and a connection member that is to clamp the thermal members together by engaging the thermal members in theft respective first recesses; wherein, one of the thermal members includes a tab extending from its first side and one of the thermal members includes a through hole, and when the memory module cooling device is installed on the memory module, the tab engages a notch in a short edge of the memory module, and the tab engages the through hole, and wherein when the memory module cooling device is installed on the memory module, a highest point of the memory module cooling device is substantially level with a top surface of the memory module.

2. The memory module cooling device of claim 1, wherein the connection member is to clamp the thermal members together by extending around the short edge of the memory module to engage the thermal members in their respective first recesses.

3. The memory module cooling device of claim 1, wherein when the connection member is engaging the thermal members in their respective first recesses, the connection member covers the tab and the through hole.

4. The memory module cooling device of claim 1, wherein, for each of the thermal members, the flat surface of the second side of the thermal member extends continuously across the entirety of the second side except for in the first recess.

5. The memory module cooling device of claim 1, wherein, for each of the thermal members, the second side includes a second recess that is recessed from the flat surface at an opposite end of the thermal member from the first recess.

6. The memory module cooling device of claim 5, wherein, for each of the thermal members, the flat surface of the second side of the thermal member extends continuously across the entirety of the second side except for in the first recess and the second recess.

7. The memory module cooling device of claim 1, wherein the through hole located within the first recess of one of the thermal members.

8. The memory module cooling device of claim 1, wherein the tab is under the first recess of one of the thermal members when the thermal member is viewed from a perspective facing the second side of the thermal member.

9. The memory module cooling device of claim 1, wherein the thermal members include top surfaces that are flat and continuous, and when the memory module cooling device is installed on the memory module, no part of the memory module cooling device is higher than the respective top surfaces of the thermal members.

10. A computing system, comprising:
the memory module cooling device of claim 1;
the memory module installed in a socket of a circuit board with the memory module cooling device installed on the memory module; and
a cold plate thermally coupled with the thermal members.

11. A memory module cooling device, comprising: two thermal members, each having: a first side to couple to a memory module; and a second side opposite from the first side, the second side having a flat surface, a first recess that is recessed from the flat surface, and a second recess that is recessed from the flat surface; a first connection member that is to clamp the thermal members together by extending around a first short edge of the memory module and engaging the thermal members in their respective first recesses; and a second connection member that is to clamp the thermal members together by extending around a second short edge of the memory module and engaging the thermal members in their respective second recesses; wherein for each of the thermal members, the flat surface of the second side of the thermal member extends continuously across the entirety of the second side except for in the first recess and the second recess.

12. The memory module cooling device of claim 11, wherein, when the memory module cooling device is installed on the memory module, a highest point of the memory module cooling device is substantially level with a top surface of the memory module.

13. A computing system, comprising:
the memory module cooling device of claim 11;
the memory module installed in a socket of a circuit board with the memory module cooling device installed on the memory module; and
a cold plate thermally coupled with the thermal members, wherein no connection members extend around the respective top surfaces of the thermal members.

14. The computing system of claim 13, wherein the cold plate extends across, and is in contact with, an entire length of the respective top surfaces of the thermal members.

15. The computing system of claim 13, wherein each of the thermal members includes a tab extending from its first side and each of the thermal members includes a through hole, and each et the tabs engages a notch in one of the first and second short edges of the memory module and one of the through holes.

16. The memory module cooling device of claim 11, wherein for each of the thermal members, the entirety of the second side, except for the first recess and the second recess, is coplanar with the flat surface.

* * * * *